(12) United States Patent
Tong et al.

(10) Patent No.: US 12,376,314 B1
(45) Date of Patent: Jul. 29, 2025

(54) METHOD FOR THRESHOLD SWITCH DEVICE, THRESHOLD SWITCH DEVICE, AND DYNAMIC MEMORY

(71) Applicant: Huazhong University of Science and Technology, Wuhan (CN)

(72) Inventors: Hao Tong, Wuhan (CN); Binhao Wang, Wuhan (CN); Xiangshui Miao, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 0 days.

(21) Appl. No.: 19/019,752

(22) Filed: Jan. 14, 2025

(30) Foreign Application Priority Data

Nov. 8, 2024 (CN) .......................... 202411596829.2

(51) Int. Cl.
*H10B 63/00* (2023.01)
*G06F 30/36* (2020.01)

(52) U.S. Cl.
CPC ............. *H10B 63/24* (2023.02); *G06F 30/36* (2020.01)

(58) Field of Classification Search
CPC ................................. H10B 63/24; G06F 30/36
See application file for complete search history.

(56) References Cited

U.S. PATENT DOCUMENTS

| | | | | |
|---|---|---|---|---|
| 2017/0372779 | A1* | 12/2017 | O'Toole | H10N 70/20 |
| 2021/0050522 | A1* | 2/2021 | Jung | H10B 63/24 |
| 2023/0337559 | A1* | 10/2023 | Cheng | H10B 63/24 |
| 2023/0360700 | A1* | 11/2023 | Richter | G11C 13/0028 |
| 2024/0015987 | A1* | 1/2024 | Cheng | H10N 70/881 |
| 2024/0179920 | A1* | 5/2024 | Rao | H10B 63/24 |
| 2024/0188456 | A1* | 6/2024 | Clima | H10B 63/24 |
| 2024/0215467 | A1* | 6/2024 | Kawai | H10B 63/20 |
| 2024/0237564 | A1* | 7/2024 | Chung | H10B 63/10 |
| 2025/0107461 | A1* | 3/2025 | Park | H10N 70/8828 |

* cited by examiner

*Primary Examiner* — Nha T Nguyen
(74) *Attorney, Agent, or Firm* — WCF IP

(57) ABSTRACT

Provided is a design method for a threshold switch device, a threshold switch device, and a dynamic memory, relating to the technical field of memories. The design method includes: testing a hold voltage, a low-resistance-state (LRS) resistance, and a threshold voltage of a threshold switch function layer; determining a target hold voltage of a threshold switch device according to the threshold voltage; determining a resistance sum of a top electrode and a bottom electrode of the threshold switch device according to the hold voltage and the LRS resistance of the threshold switch function layer and the target hold voltage of the threshold switch device; and selecting materials and thin film parameters of the top electrode and the bottom electrode according to the resistance sum of the top electrode and the bottom electrode of the threshold switch device, to design the threshold switch device meeting the target hold voltage.

20 Claims, 4 Drawing Sheets

METHOD FOR THRESHOLD SWITCH DEVICE, THRESHOLD SWITCH DEVICE, AND DYNAMIC MEMORY

CROSS REFERENCE TO RELATED APPLICATION

This patent application claims the benefit and priority of Chinese Patent Application No. 2024115968292, filed with the China National Intellectual Property Administration on Nov. 8, 2024, the disclosure of which is incorporated by reference herein in its entirety as part of the present application.

TECHNICAL FIELD

The present disclosure relates to the technical field of memories, and in particular, to a design method for a threshold switch device, a threshold switch device, and a dynamic memory.

BACKGROUND ART

An ovonic threshold switch (OTS) can realize threshold transition under the control of an external electrical signal. The specific process is as follows: when an electrical signal is applied to a switch device unit and exceeds a threshold voltage, a material changes from a high-resistance state to a low-resistance state, and the device is in an on state. At this time, the applied electrical signal is reduced, and when the signal voltage is less than a hold voltage, the material changes from the low-resistance state to the high-resistance state, and the device is in an off state. If a transistor in a dynamic random access memory (DRAM) is replaced with a threshold switch device, the storage density can be greatly increased because the threshold switch is a two-port device, consumes less peripheral circuits, and is easy for three-dimensional stacking. The hold voltage of the threshold switch device determines a write operation window of the DRAM. However, the academic community has always believed that the hold voltage is an inherent characteristic of the threshold switch device and there is no way to adjust it, thus limiting the improvement of DRAM performance.

SUMMARY

An objective of the present disclosure is to provide a design method for a threshold switch device, a threshold switch device, and a dynamic memory, which can design threshold switch devices meeting various hold voltages.

To achieve the above objective, the present disclosure provides the following solutions:

According to a first aspect, the present disclosure provides a design method for a threshold switch device, including:
  testing a hold voltage, a low-resistance-state (LRS) resistance, and a threshold voltage of a threshold switch function layer;
  determining a target hold voltage of a threshold switch device according to the threshold voltage;
  determining a resistance sum of a top electrode and a bottom electrode of the threshold switch device according to the hold voltage and the LRS resistance of the threshold switch function layer and the target hold voltage of the threshold switch device; and
  selecting materials and thin film parameters of the top electrode and the bottom electrode according to the resistance sum of the top electrode and the bottom electrode of the threshold switch device, to design the threshold switch device meeting the target hold voltage.

Optionally, the target hold voltage of the threshold switch device is less than or equal to the threshold voltage of the threshold switch function layer.

Optionally, the resistance sum of the top electrode and the bottom electrode of the threshold switch device is determined according to the following formula:

$$R = (V_{Hold} - V_{hold}) * R_{\_low} / V_{hold},$$

where, R is the resistance sum of the top electrode and the bottom electrode; $V_{Hold}$ is the target hold voltage of the threshold switch device; $V_{hold}$ is the hold voltage of the threshold switch function layer; and $R_{\_low}$ is the LRS resistance of the threshold switch function layer.

Optionally, the materials of the top electrode and the bottom electrode include at least one of C, Al, Co, Ni, Pt, Au, Ag, Cu, Wu, and Pd.

According to a second aspect, the present disclosure provides a threshold switch device designed on the basis of the above design method for a threshold switch device, including: a threshold switch function layer, a top electrode, and a bottom electrode, where the threshold switch function layer has one end connected to the top electrode and the other end connected to the bottom electrode;
  the threshold switch function layer has a high-resistance state and a low-resistance state; when voltages at two ends of the threshold switch function layer exceed the threshold voltage of the threshold switch function layer, the threshold switch function layer is switched from the high-resistance state to the low-resistance state; and when the voltages at the two ends of the threshold switch function layer in the low-resistance state are lower than the hold voltage of the threshold switch function layer, the threshold switch function layer is switched from the low-resistance state to the high-resistance state.

Optionally, when the threshold switch function layer is in the high-resistance state, the threshold voltage of the threshold switch device is the same as the threshold voltage of the threshold switch function layer.

Optionally, a material of the threshold switch function layer includes an ovonic threshold switch (OTS) material, a conductive bridge material, and a metal insulator transition material.

Optionally, the OTS material includes a Se-based compound system, a Te-based compound system, and an S-based compound system.

According to a third aspect, the present disclosure provides a dynamic memory, including: a threshold switch device and a capacitor which are connected in series, where the threshold switch device is the above threshold switch device; an end of the threshold switch device not connected to the capacitor is an input end of the dynamic memory; and an end of the capacitor not connected to the threshold switch device is an output end of the dynamic memory.

Optionally, a lower limit of a write operation window of the dynamic memory is a threshold voltage of the threshold switch device, and an upper limit of the write operation window of the dynamic memory is a sum of the threshold voltage and a target hold voltage of the threshold switch device.

According to specific embodiments provided in the present disclosure, the present disclosure discloses the following technical effects:

The present disclosure provides a design method for a threshold switch device, a threshold switch device, and a dynamic memory. The method includes: testing a hold voltage, an LRS resistance, and a threshold voltage of a threshold switch function layer; determining a target hold voltage of a threshold switch device according to the threshold voltage; determining a resistance sum of a top electrode and a bottom electrode of the threshold switch device according to the hold voltage and the LRS resistance of the threshold switch function layer and the target hold voltage of the threshold switch device; and selecting materials and thin film parameters of the top electrode and the bottom electrode according to the resistance sum of the top electrode and the bottom electrode of the threshold switch device, to design the threshold switch device meeting the target hold voltage. According to the present disclosure, the target hold voltage required by the threshold switch device can be pre-determined, and then the threshold switch device meeting the corresponding target hold voltage is calculated in combination with the hold voltage and the LRS resistance of the threshold switch function layer. Obviously, various target hold voltages of the threshold switch device can be realized through various resistance sums of the top electrode and the bottom electrode. In this way, the target hold voltage of the threshold switch device can be adjusted by changing the resistance sum of the top electrode and the bottom electrode, thereby designing a threshold switch device meeting various hold voltages.

BRIEF DESCRIPTION OF THE DRAWINGS

To describe the technical solutions in the examples of this application or in the prior art more clearly, the following briefly describes the accompanying drawings required for the examples. Apparently, the accompanying drawings in the following description show merely some examples of this application, and a person of ordinary skill in the art may still derive other accompanying drawings from these accompanying drawings without creative efforts.

Figure 1:
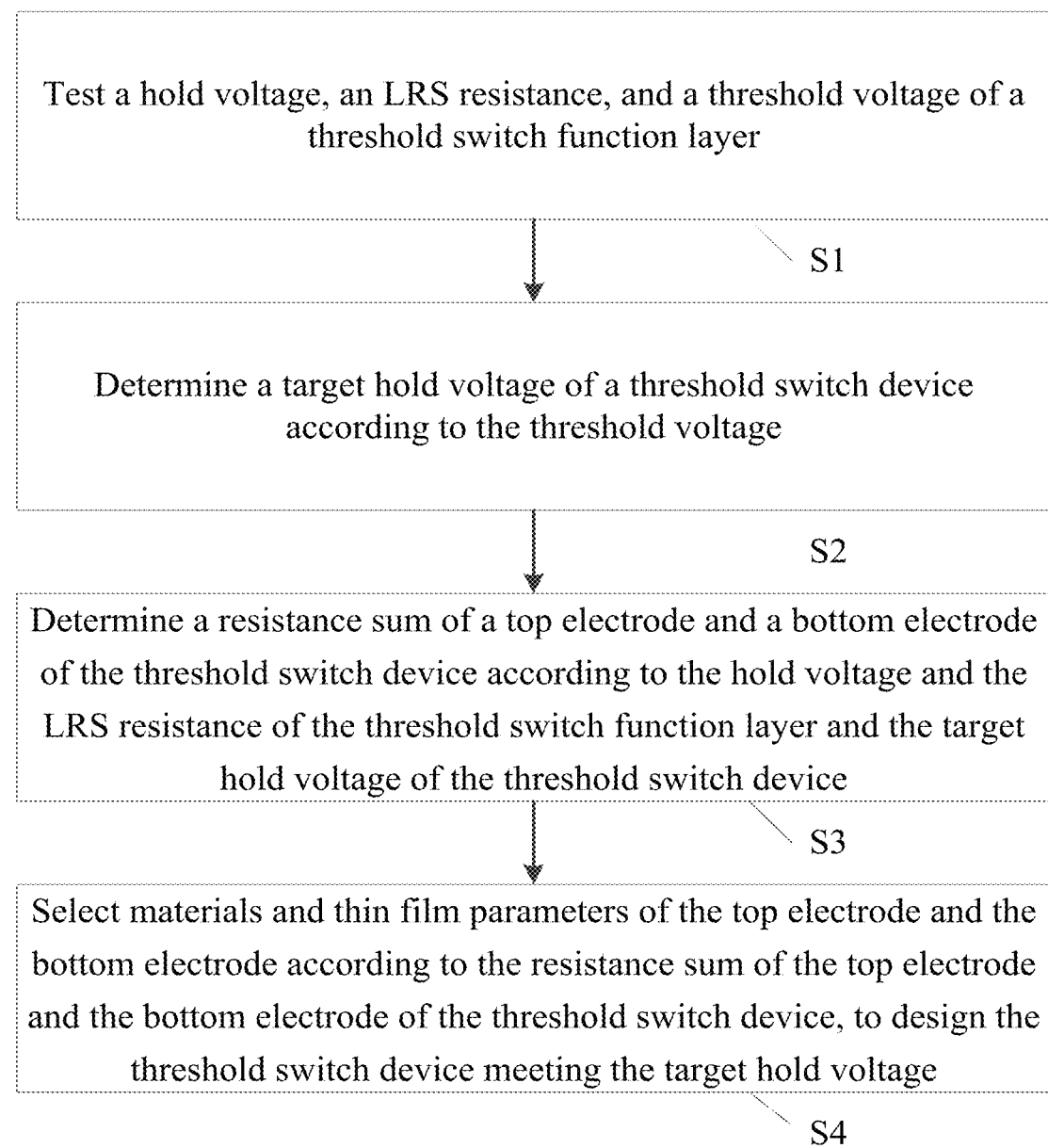
FIG. 1 is a schematic flowchart of a design method for a threshold switch device according to Embodiment 1 of the present disclosure.

Reference Numerals: 1—Top electrode; 2—Threshold switch function layer; 3—Bottom electrode.

DETAILED DESCRIPTION OF THE EMBODIMENTS

The technical solutions in the embodiments of the present disclosure are clearly and completely described below with reference to the drawings in the embodiments of the present disclosure. Apparently, the described embodiments are merely some rather than all of the embodiments of the present disclosure. All other embodiments obtained by those of ordinary skill in the art based on the embodiments of the present disclosure without creative efforts should fall within the protection scope of the present disclosure.

To make the above objectives, features, and advantages of the present disclosure more obvious and easier to understand, the present disclosure will be further described in detail with reference to the accompanying drawings and specific implementations.

Embodiment 1

As shown in FIG. 1, this embodiment provides a design method for a threshold switch device, including the following step S1 to step S4.

Step S1: a hold voltage $V_{hold}$, an LRS resistance $R_{\_low}$, and a threshold voltage $V_{th}$ of a threshold switch function layer 2 are tested.

Step S2: a target hold voltage $V_{Hold}$ of a threshold switch device is determined according to the threshold voltage $V_{th}$. The target hold voltage $V_{Hold}$ of the threshold switch device is less than or equal to the threshold voltage $V_{th}$ of the threshold switch function layer 2.

Step S3: a resistance sum of a top electrode 1 and a bottom electrode 3 of the threshold switch device is determined according to the hold voltage and the LRS resistance of the threshold switch function layer 2 and the target hold voltage of the threshold switch device.

Step S4: appropriate materials of the top electrode 1 and the bottom electrode 3 are selected according to the resistance sum of the top electrode 1 and the bottom electrode 3 of the threshold switch device, and then preparation processes of the top electrode 1 and the bottom electrode 3 are regulated to obtain thin film parameters meeting resistance requirements, such that the resistance sum of the top electrode 1 and the bottom electrode 3 meets a result calculated in step S3, and finally, a threshold switch device meeting the target hold voltage is designed. The thin film parameters include preparation parameters of a thin film, and doping, thickness, element components, etc. of the thin film itself. The regulation means is a conventional regulation means, and aims to enable the thin film to reach a target resistance.

As an optional implementation, the resistance sum of the top electrode 1 and the bottom electrode 3 of the threshold switch device is determined according to the following formula:

$$R = (V_{Hold} - V_{hold}) * R_{\_low} / V_{hold};$$

where, R is the resistance sum of the top electrode 1 and the bottom electrode 3; $V_{Hold}$ is the target hold voltage of the threshold switch device; $V_{hold}$ is the hold voltage of the threshold switch function layer 2; and $R_{\_low}$ is the LRS resistance of the threshold switch function layer 2.

As an optional implementation, the materials of the top electrode 1 and the bottom electrode 3 include at least one of C, Al, Co, Ni, Pt, Au, Ag, Cu, Wu, and Pd, to adjust various resistance sums of the top electrode and the bottom electrode.

In this embodiment, a method of regulating the hold voltage of the threshold switch device is provided, to widen application scenarios of the threshold switch device. Specifically, the hold voltage $V_{Hold}$ of the threshold switch device can be adjusted by adjusting the resistance sum of the top electrode and the bottom electrode, breaking the view that "the hold voltage of the threshold switch device is an inherent characteristic of the threshold switch device and there is no way to adjust it". The adjustability of the hold voltage of the threshold switch device can improve DRAM performance.

Embodiment 2

Figure 2:
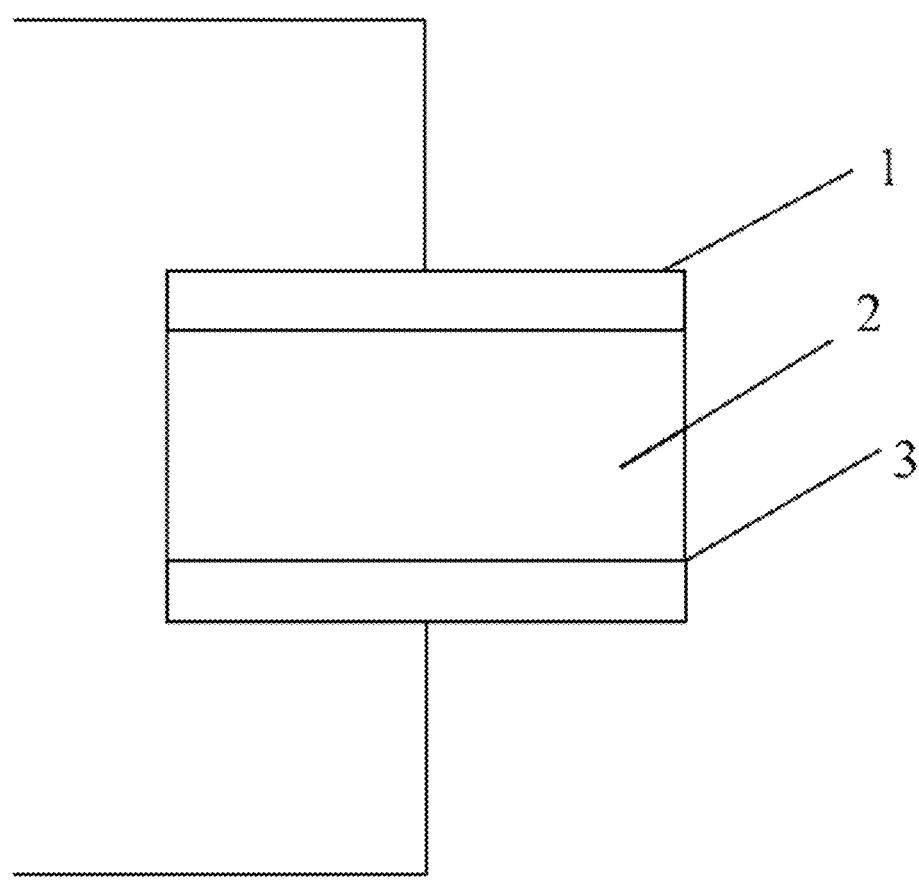
FIG. 2 is a schematic structural diagram of a threshold switch device according to Embodiment 2 of the present disclosure.

As shown in FIG. 2, this embodiment provides a threshold switch device. The threshold switch device is designed on the basis of the design method for a threshold switch device described in Embodiment 1, and includes: a threshold switch function layer 2, a top electrode 1, and a bottom electrode 3. The threshold switch function layer 2 has one end connected to the top electrode 1 and the other end connected to the bottom electrode 3.

As an optional implementation, a material of the threshold switch function layer 2 includes an ovonic threshold switch (OTS) material, a conductive bridge material, and a metal insulator transition material.

As an optional implementation, the OTS material is composed of a sulfur-based compound, and mainly includes three material systems: a Se-based compound system, a Te-based compound system, and an S-based compound system.

The threshold switch function layer 2 has a high-resistance state and a low-resistance state; when voltages at two ends of the threshold switch function layer 2 exceed the threshold voltage of the threshold switch function layer 2, the threshold switch function layer 2 is switched from the high-resistance state to the low-resistance state; and when the voltages at the two ends of the threshold switch function layer 2 in the low-resistance state are lower than the hold voltage of the threshold switch function layer 2, the threshold switch function layer 2 is switched from the low-resistance state to the high-resistance state. By employing this characteristic of the threshold switch function layer 2 and adjusting the resistance sum of the top electrode and the bottom electrode, the total hold voltage $V_{Hold}$ of the threshold switch device can be regulated, thereby improving an operation window of a 1S1C dynamic memory thereof.

Figure 3:
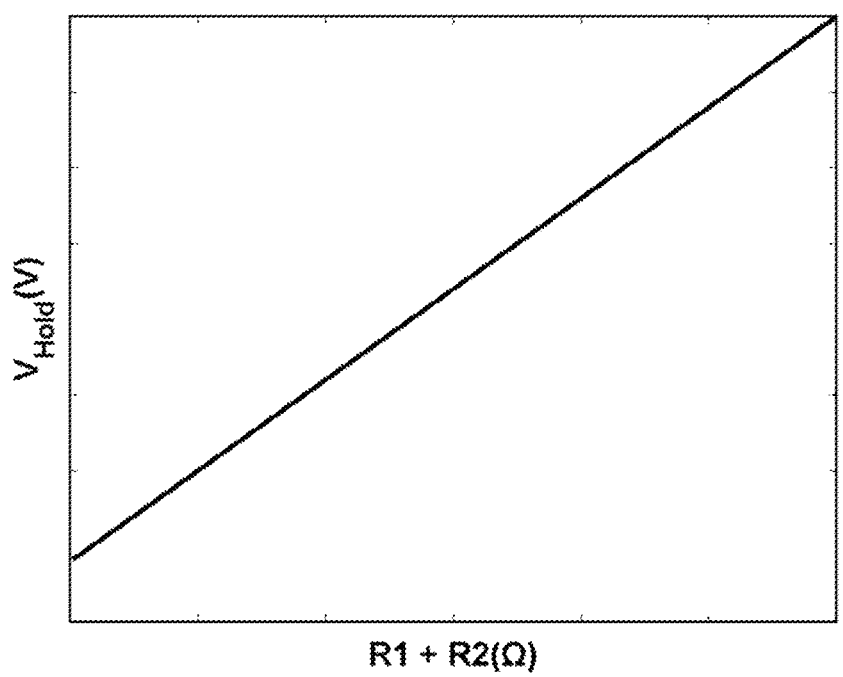
FIG. 3 is a schematic diagram of an expression of regulating a total hold voltage $V_{Hold}$ of a threshold switch device according to Embodiment 2 of the present disclosure.

The hold voltage $V_{Hold}$ of the threshold switch device is $V_{Hold} = V_{hold} + I_{hold}*R$, where R is the resistance sum of the top electrode 1 and the bottom electrode 3. FIG. 3 shows a positive linear relationship between the hold voltage $V_{Hold}$ of the threshold switch device and the resistance sum R of the top electrode and the bottom electrode. The greater the resistance sum R of the top electrode and the bottom electrode, the more obvious the positive adjustment effect on $V_{Hold}$. $I_{hold} = V_{hold}/R_{\_low}$, where $R_{\_low}$ is an LRS resistance of the threshold switch function layer 2. R is greater than or equal to 0 and less than or equal to $R_{max}$, where $R_{max}$ is the value of R when $V_{Hold}$ is equal to $V_{th}$. The hold voltage $V_{Hold}$ of the threshold switch device can be adjusted by adjusting the resistance of R.

Further, preferably, the threshold switch device has a threshold voltage $V_{TH}$. Because when the threshold switch function layer 2 is in the high-resistance state, a current passing through the threshold switch device is very small, partial voltages of the top electrode 1 and the bottom electrode 3 can be ignored. Therefore, the threshold voltage $V_{TH}$ of the threshold switch device is basically consistent with the threshold voltage $V_{th}$ of the threshold switch function layer 2, and is not affected by the resistances of the top electrode 1 and the bottom electrode 3.

Figure 4:
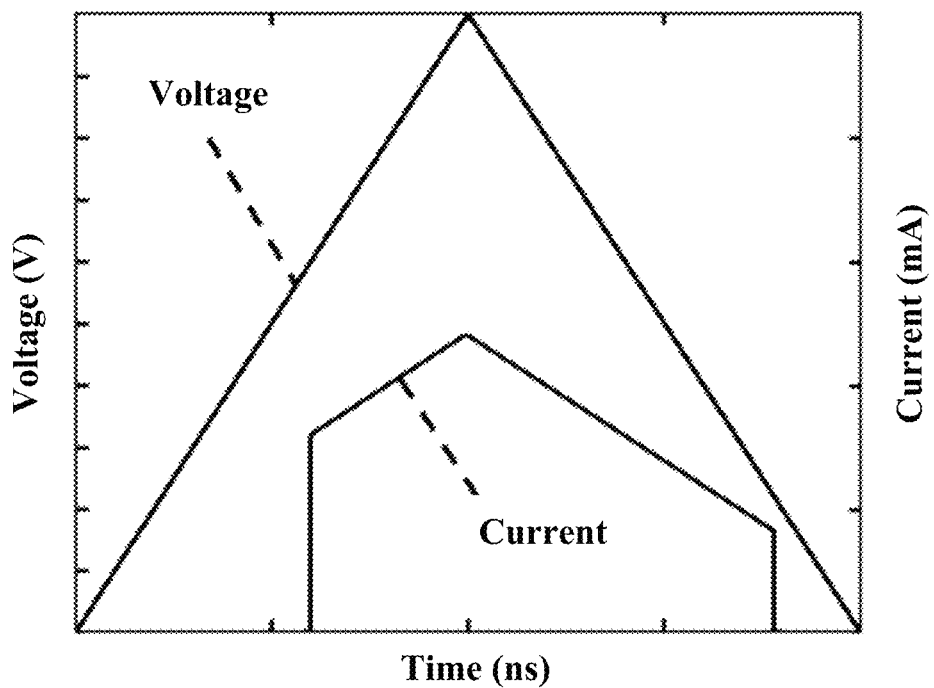
FIG. 4 is a schematic diagram of changes of a current passing through a threshold switch device after applying triangular waves to two ends of the threshold switch device according to Embodiment 2 of the present disclosure.

A voltage waveform as shown in FIG. 4 is applied to two ends of the threshold switch device. At an initial moment, the applied voltage is less than the threshold voltage $V_{th}$ of the threshold switch function layer 2, and the threshold switch function layer 2 is in the high-resistance state. At this time, a very small current flows through the circuit. FIG. 4 shows that there is no current flowing through the circuit, ignoring the weak current in the circuit when the threshold switch function layer 2 is in the high-resistance state. When the voltage rises to be greater than the threshold voltage $V_{th}$ of the threshold switch function layer 2, the threshold switch function layer 2 is switched from the high-resistance state to the low-resistance state, and the current in the circuit suddenly increases and changes with the applied voltage. When the voltage drops to be less than the hold voltage $V_{hold}$ of the threshold switch function layer 2, the threshold switch function layer 2 is switched from the low-resistance state to the high-resistance state, and the current in the circuit suddenly decreases, almost to the extent that no current flows through.

Because there is approximately no current flowing through the circuit before the applied voltage rises to $V_{th}$, the total threshold voltage $V_{TH}$ of the threshold switch device is equal to the threshold voltage $V_{th}$ of the threshold switch function layer 2, that is, adjusting the resistance sum of the top electrode and the bottom electrode will not affect the magnitude of $V_{TH}$. Before the applied voltage drops to $V_{hold}$, there is a large on-state current in the circuit. Therefore, the total hold voltage $V_{Hold}$ of the threshold switch device is equal to the sum of the hold voltage $V_{hold}$ of the threshold switch function layer 2 and the partial voltages of the resistances of the top electrode and the bottom electrode, that is, $V_{Hold}$ can be adjusted by adjusting the resistance sum of the top electrode and the bottom electrode. The specific regulation method is as follows:

When the hold voltage $V_{Hold}$ of the threshold switch device needs to be increased, the materials of the top electrode and the bottom electrode are selected and adjusted from C, Al, Co, Ni, Pt, Au, Ag, Cu, Wu, and Pd to increase the resistance sum R1+R2 of the top electrode and the bottom electrode. When the voltages at the two ends of the threshold switch function layer 2 are equal to $V_{hold}$, the on-state current in the circuit is $I_{hold}$. At this time, the partial voltages of the resistances of the top electrode and the bottom electrode increase, such that the total hold voltage $V_{Hold}$ of the threshold switch device increases.

When the hold voltage $V_{Hold}$ of the threshold switch device needs to be decreased, the materials of the top electrode and the bottom electrode are selected and adjusted from C, Al, Co, Ni, Pt, Au, Ag, Cu, Wu, and Pd to decrease the resistance sum R1+R2 of the top electrode and the bottom electrode. When the voltages at the two ends of the threshold switch function layer 2 are equal to $V_{hold}$, the on-state current in the circuit is $I_{hold}$. At this time, the partial voltages of the resistances of the top electrode and the bottom electrode decrease, such that the total hold voltage $V_{Hold}$ of the threshold switch device decreases.

The following examples further illustrate that $V_{Hold}$ can be regulated by adjusting the resistance sum of the top electrode and the bottom electrode.

Example 1

Figure 5:
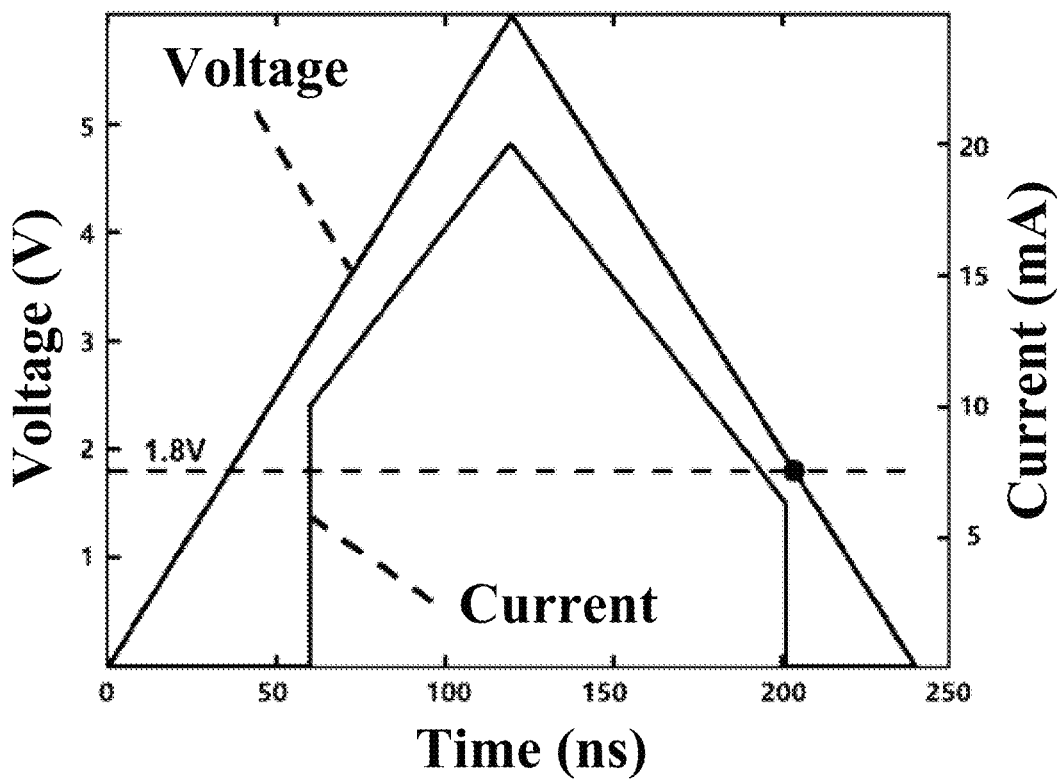
FIG. 5 is an imitated diagram of changes of a current passing through a threshold switch device and a schematic diagram of a hold voltage $V_{Hold}$ of the threshold switch device after applying triangular waves having a peak of 6 V and a duration of 240 ns to two ends of the threshold switch device in Example 1 according to Embodiment 2 of the present disclosure.

In the threshold switch device, the threshold switch function layer 2 has a threshold voltage of 3 V, a hold voltage of 1.2 V, and an on-state current under the hold voltage of 6 mA, and the resistance sum of the top electrode and the bottom electrode is adjusted to 100Ω. Triangular waves having a peak of 6 V and a duration of 240 ns are applied to the two ends of the threshold switch device: in the initial state, the threshold switch function layer 2 is in the high-resistance state, and the current passing through is very small. At this time, the voltages at the two ends of the threshold switch function layer 2 are approximately equal to the applied voltages at the two ends of the threshold switch device. When the voltages at the two ends of the threshold switch function layer 2 increase to 3 V, the threshold switch function layer 2 is switched from the high-resistance state to the low-resistance state, the current increases, and the resistances of the top electrode and the bottom electrode begin to subject to voltage division. When Vs gradually decreases, causing the voltages at the two ends of the threshold switch function layer 2 to drop to 1.2 V, the on-state current through the circuit is 6 mA, the partial voltages of the top electrode and the bottom electrode are 0.6 V, and the total hold voltage $V_{Hold}$ of the threshold switch device is 1.8 V, as shown in FIG. 5.

Example 2

Figure 6:
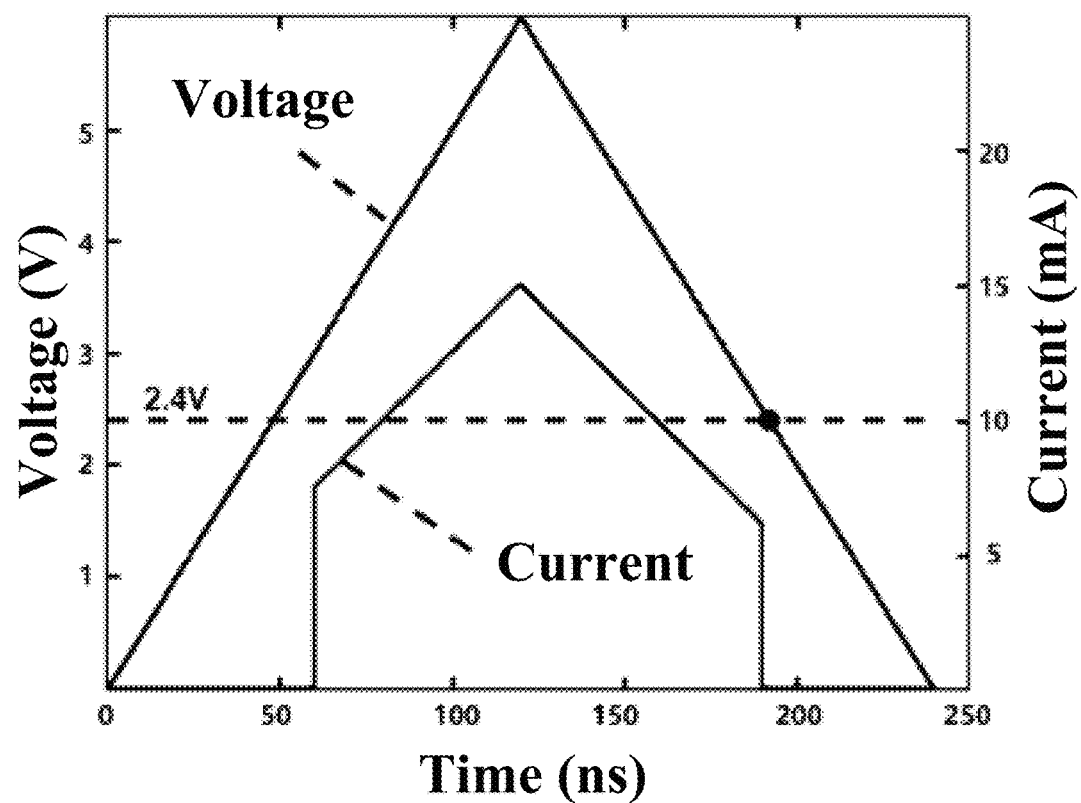
FIG. 6 is an imitated diagram of changes of a current passing through a threshold switch device and a schematic diagram of a hold voltage $V_{Hold}$ of the threshold switch device after applying triangular waves having a peak of 6 V and a duration of 240 ns to two ends of the threshold switch device in Example 2 according to Embodiment 2 of the present disclosure.

In the threshold switch device, the threshold switch function layer 2 has a threshold voltage of 3 V, a hold voltage of 1.2 V, and an on-state current under the hold voltage of 6 mA, and the resistance sum of the top electrode and the bottom electrode is adjusted to 200Ω. Triangular waves having a peak of 6 V and a duration of 240 ns are applied to the two ends of the threshold switch device: in the initial state, the threshold switch function layer 2 is in the high-resistance state, and the current passing through is very small. At this time, the voltages at the two ends of the threshold switch function layer 2 are approximately equal to the applied voltages Vs at the two ends of the threshold switch device. When the voltages at the two ends of the threshold switch function layer 2 increase to 3 V, the threshold switch function layer 2 is switched from the high-resistance state to the low-resistance state, the current increases, and the resistances of the top electrode and the bottom electrode begin to subject to voltage division. When Vs gradually decreases, causing the voltages at the two ends of the threshold switch function layer 2 to drop to 1.2 V, the on-state current through the circuit is 6 mA, the partial voltages of the top electrode and the bottom electrode are 1.2 V, and the total hold voltage $V_{Hold}$ of the threshold switch device is 2.4V, as shown in FIG. 6.

This embodiment provides a threshold switch device. The hold voltage of the threshold switch device can be changed by adjusting the resistance sum of the top electrode and the bottom electrode. Therefore, the hold voltage required by the threshold switch device can be flexibly regulated according to requirements, thereby achieving the adjustability of the hold voltage of the threshold switch device, and breaking the view that "the hold voltage of the threshold switch device is an inherent characteristic of the threshold switch device and there is no way to adjust it". The adjustability of the hold voltage of the threshold switch device can improve DRAM performance.

Embodiment 3

Figure 7:
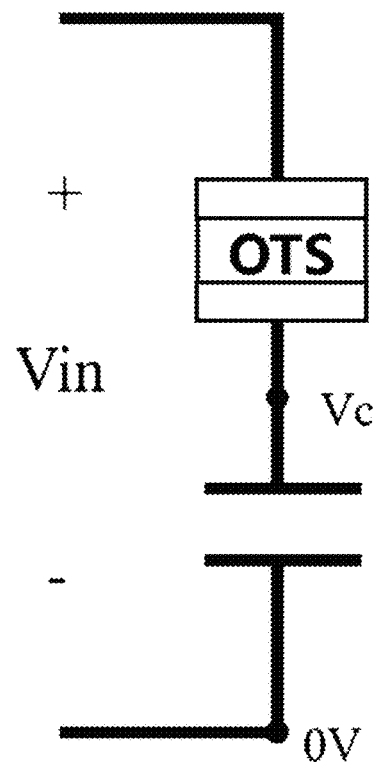
FIG. 7 is a schematic structural diagram of a 1S1C dynamic memory consisting of a threshold switch device according to Embodiment 3 of the present disclosure.

As shown in FIG. 7, this embodiment provides a dynamic memory, including: a threshold switch device and a capacitor which are connected in series. The threshold switch device is the above threshold switch device as described in Embodiment 2. An end of the threshold switch device not connected to the capacitor is an input end of the dynamic memory, and an end of the capacitor not connected to the threshold switch device is an output end of the dynamic memory.

A lower limit of a write operation window of the dynamic memory is the threshold voltage of the threshold switch device, and an upper limit of the write operation window of the dynamic memory is a sum of the threshold voltage and the target hold voltage of the threshold switch device. Therefore, the write operation window of the dynamic memory can be improved by increasing the resistance sum R of the top electrode 1 and the bottom electrode 3.

The two examples in Embodiment 2 are used as examples to illustrate that the write window of the dynamic memory can be improved by increasing the resistance sum R of the top electrode 1 and the bottom electrode 3. In the threshold switch device, the threshold switch function layer 2 has a threshold voltage of 3 V, a hold voltage of 1.2 V, and an on-state current under the hold voltage of 6 mA, and the resistance sum of the top electrode and the bottom electrode is 100Ω. Triangular waves having a peak of 6 V and a duration of 240 ns are applied to the two ends of the threshold switch device. When the applied voltage gradually decreases, causing the voltages at the two ends of the threshold switch function layer 2 to drop to 1.2 V, the on-state current through the circuit is 6 mA, the partial voltages of the top electrode and the bottom electrode are 0.6 V, and the total hold voltage $V_{Hold}$ of the threshold switch device is 1.8 V. For the 1S1C dynamic memory composed of the threshold switch device, the lower limit of the write operation window is $V_{TH}$, and the upper limit is $V_{TH}+V_{Hold}$. Therefore, the operation window of the 1S1C dynamic memory is 1.8 V.

Now the resistance sum of the top electrode and the bottom electrode is adjusted to 200Ω. The triangular waves having a peak of 6 V and a duration of 240 ns are still applied to the two ends of the threshold switch device. When the applied voltage gradually decreases, causing the voltages at the two ends of the threshold switch function layer 2 to drop to 1.2 V, the on-state current through the circuit is 6 mA, the partial voltages of the top electrode and the bottom electrode are 1.2V, and the total hold voltage $V_{Hold}$ of the threshold switch device is 2.4 V. For the 1S1C dynamic memory composed of the threshold switch device, the lower limit of the write operation window is $V_{TH}$, and the upper limit is $V_{TH}+V_{Hold}$. Therefore, the write operation window of the 1S1C dynamic memory is 2.4 V. Compared with the write operation window before the resistance sum of the top electrode and the bottom electrode is adjusted, the space of 0.6 V is increased.

In this embodiment, the hold voltage of the threshold switch device can be changed by adjusting the resistance sum of the top electrode and the bottom electrode, and the write operation window of the 1S1C dynamic memory composed of the threshold switch device can be further improved, thereby improving the interference resistance of the dynamic memory to noise and voltage fluctuations, and also helping to improve the reliability and fault tolerance of the memory and reduce the bit error rate.

The technical characteristics of the above embodiments can be employed in arbitrary combinations. To provide a concise description of these embodiments, all possible combinations of all the technical characteristics of the above embodiments may not be described; however, these combinations of the technical characteristics should be construed as falling within the scope defined by the specification as long as no contradiction occurs.

Several examples are used herein for illustration of the principles and implementations of the present disclosure. The description of the foregoing embodiments is used to help illustrate the method of the present disclosure and the core principles thereof. In addition, those of ordinary skill in the art can make various modifications in terms of specific implementations and scope of application in accordance with the teachings of the present disclosure. In conclusion, the content of the present specification shall not be construed as a limitation to the present disclosure.

What is claimed is:

1. A design method for a threshold switch device, comprising:
    testing a hold voltage, a low-resistance-state (LRS) resistance, and a threshold voltage of a threshold switch function layer;
    determining a target hold voltage of a threshold switch device according to the threshold voltage;
    determining a resistance sum of a top electrode and a bottom electrode of the threshold switch device according to the hold voltage and the LRS resistance of the threshold switch function layer and the target hold voltage of the threshold switch device; and
    selecting materials and thin film parameters of the top electrode and the bottom electrode according to the resistance sum of the top electrode and the bottom electrode of the threshold switch device, to design the threshold switch device meeting the target hold voltage.

2. The design method for a threshold switch device according to claim 1, wherein the target hold voltage of the threshold switch device is less than or equal to the threshold voltage of the threshold switch function layer.

3. The design method for a threshold switch device according to claim 1, wherein the resistance sum of the top electrode and the bottom electrode of the threshold switch device is determined according to the following formula:

$$R=(V_{Hold}-V_{hold})*R_{\_low}/V_{hold};$$

wherein, R is the resistance sum of the top electrode and the bottom electrode; $V_{Hold}$ is the target hold voltage of the threshold switch device; $V_{hold}$ is the hold voltage of the threshold switch function layer; and $R_{\_low}$ is the LRS resistance of the threshold switch function layer.

4. The design method for a threshold switch device according to claim 1, wherein the materials of the top electrode and the bottom electrode comprise at least one of C, Al, Co, Ni, Pt, Au, Ag, Cu, Wu, and Pd.

5. A threshold switch device designed on the basis of the design method for a threshold switch device according to claim 1, comprising: a threshold switch function layer, a top electrode, and a bottom electrode, wherein the threshold switch function layer has one end connected to the top electrode and the other end connected to the bottom electrode; the threshold switch function layer has a high-resistance state and a low-resistance state; when voltages at two ends of the threshold switch function layer exceed the threshold voltage of the threshold switch function layer, the threshold switch function layer is switched from the high-resistance state to the low-resistance state; and when the voltages at the two ends of the threshold switch function layer in the low-resistance state are lower than the hold voltage of the threshold switch function layer, the threshold switch function layer is switched from the low-resistance state to the high-resistance state.

6. The threshold switch device according to claim 5, wherein when the threshold switch function layer is in the high-resistance state, the threshold voltage of the threshold switch device is the same as the threshold voltage of the threshold switch function layer.

7. The threshold switch device according to claim 5, wherein a material of the threshold switch function layer comprises an ovonic threshold switch (OTS) material, a conductive bridge material, and a metal insulator transition material.

8. The threshold switch device according to claim 7, wherein the OTS material comprises a Se-based compound system, a Te-based compound system, and an S-based compound system.

9. A dynamic memory, comprising: a threshold switch device and a capacitor which are connected in series, wherein the threshold switch device is the threshold switch device according to claim 5; an end of the threshold switch device not connected to the capacitor is an input end of the dynamic memory; and an end of the capacitor not connected to the threshold switch device is an output end of the dynamic memory.

10. The dynamic memory according to claim 9, wherein a lower limit of a write operation window of the dynamic memory is a threshold voltage of the threshold switch device, and an upper limit of the write operation window of the dynamic memory is a sum of the threshold voltage and a target hold voltage of the threshold switch device.

11. The threshold switch device according to claim 5, wherein the target hold voltage of the threshold switch device is less than or equal to the threshold voltage of the threshold switch function layer.

12. The threshold switch device according to claim 5, wherein the resistance sum of the top electrode and the bottom electrode of the threshold switch device is determined according to the following formula:

$$R=(V_{Hold}-V_{hold})*R_{\_low}/V_{hold};$$

wherein, R is the resistance sum of the top electrode and the bottom electrode; $V_{Hold}$ is the target hold voltage of the threshold switch device; $V_{hold}$ is the hold voltage of the threshold switch function layer; and $R_{\_low}$ is the LRS resistance of the threshold switch function layer.

13. The threshold switch device according to claim 5, wherein the materials of the top electrode and the bottom electrode comprise at least one of C, Al, Co, Ni, Pt, Au, Ag, Cu, Wu, and Pd.

14. The threshold switch device according to claim 11, wherein when the threshold switch function layer is in the high-resistance state, the threshold voltage of the threshold switch device is the same as the threshold voltage of the threshold switch function layer.

15. The threshold switch device according to claim 12, wherein when the threshold switch function layer is in the high-resistance state, the threshold voltage of the threshold switch device is the same as the threshold voltage of the threshold switch function layer.

16. The threshold switch device according to claim 13, wherein when the threshold switch function layer is in the high-resistance state, the threshold voltage of the threshold switch device is the same as the threshold voltage of the threshold switch function layer.

17. The threshold switch device according to claim 11, wherein a material of the threshold switch function layer comprises an ovonic threshold switch (OTS) material, a conductive bridge material, and a metal insulator transition material.

18. The threshold switch device according to claim 12, wherein a material of the threshold switch function layer comprises an ovonic threshold switch (OTS) material, a conductive bridge material, and a metal insulator transition material.

19. The threshold switch device according to claim 13, wherein a material of the threshold switch function layer comprises an ovonic threshold switch (OTS) material, a conductive bridge material, and a metal insulator transition material.

20. The dynamic memory according to claim 9, wherein when the threshold switch function layer is in the high-resistance state, the threshold voltage of the threshold switch device is the same as the threshold voltage of the threshold switch function layer.

\* \* \* \* \*